(12) United States Patent
Gupta et al.

(10) Patent No.: US 7,366,002 B2
(45) Date of Patent: Apr. 29, 2008

(54) METHOD AND STORAGE DEVICE FOR THE PERMANENT STORAGE OF DATA

(75) Inventors: Siddharth Gupta, Bangalore (IN);
Jean-Yves Larguier, Antibes (FR);
Gunther Lehmann, Holzkirchen (DE);
Yannick Martelloni, Munich (DE)

(73) Assignee: Infineon Technologies AG, Munich (DE)

( * ) Notice: Subject to any disclaimer, the term of this patent is extended or adjusted under 35 U.S.C. 154(b) by 226 days.

(21) Appl. No.: 11/267,491

(22) Filed: Nov. 4, 2005

(65) Prior Publication Data
US 2006/0133128 A1 Jun. 22, 2006

(30) Foreign Application Priority Data
Nov. 5, 2004 (DE) .................... 10 2004 053 574

(51) Int. Cl.
*G11C 17/00* (2006.01)
(52) U.S. Cl. .................. 365/100; 365/207; 365/203
(58) Field of Classification Search ............... 365/100, 365/207, 203
See application file for complete search history.

(56) References Cited
U.S. PATENT DOCUMENTS 6,064,605 A * 5/2000 Muranaka et al. .......... 365/190
6,424,556 B1 7/2002 Kablanian et al.
6,639,862 B2 * 10/2003 Spirkl ........................ 365/222
6,819,578 B2 * 11/2004 Regev .......................... 365/49
7,054,206 B2 * 5/2006 Tellier ........................ 365/200

OTHER PUBLICATIONS

You-Sung Chang, et al., "Conforming Block Inversion for Low Power Memory," *IEEE Transactions on Very Large Scale Integration (VLSI) Systems*, vol. 10, No. 1, Feb. 2002, pp. 15-19.

* cited by examiner

*Primary Examiner*—Anh Phung
(74) *Attorney, Agent, or Firm*—Brinks Hofer Gilson & Lione (57) ABSTRACT

It is proposed that bitline inversion coding data be integrally stored in the structure of a column multiplexer of a storage device. For this purpose, connections to a predefined potential are selectively provided at connection points, which are respectively assigned to one of the bitlines connected to the column multiplexer, in dependence on whether or not the assignment of a first state and of a second state of memory cells, connected to the bitline, to a binary value "0" and to a binary value "1" is inverted for the respective bitline. The connection points are connected to a common nodal point via switching means. The switching means are activated through control signals of the column multiplexer. Selection signals for activating inverter means, in order to effect a selective inversion of values read out from the memory cells, are generated in dependence on the signal level at the common nodal point. A precharging of the common nodal point is preferably effected between to read-out operations in each case, for which purpose precharging switching means are provided.

11 Claims, 6 Drawing Sheets

Prior Art

FIG 6　Prior Art

METHOD AND STORAGE DEVICE FOR THE PERMANENT STORAGE OF DATA

RELATED APPLICATIONS

The present patent document claims priority to German Application Serial No. DE 10 2004 053 574.4, filed Nov. 5, 2004, the entirety of which is hereby incorporated by reference.

BACKGROUND

The present invention relates to a method and to a device for the permanent storage of data, wherein, in particular, the advantages of a bitline inversion coding are to be exploited.

Permanent storage devices, so-called ROM (read-only memory) storage devices used in current electronic systems are based on the fact that, in the memory production process, one of two possible states is respectively assigned to memory cells of the memory, in order thereby to store a first and a second value respectively. In this case, for example, a first state of the memory cell encodes a binary value "0", whilst a second state encodes a binary value "1". The memory cells are addressable via wordlines and bitlines, such that the state of the individual memory cells can be evaluated via the corresponding bitline.

Figure 5:
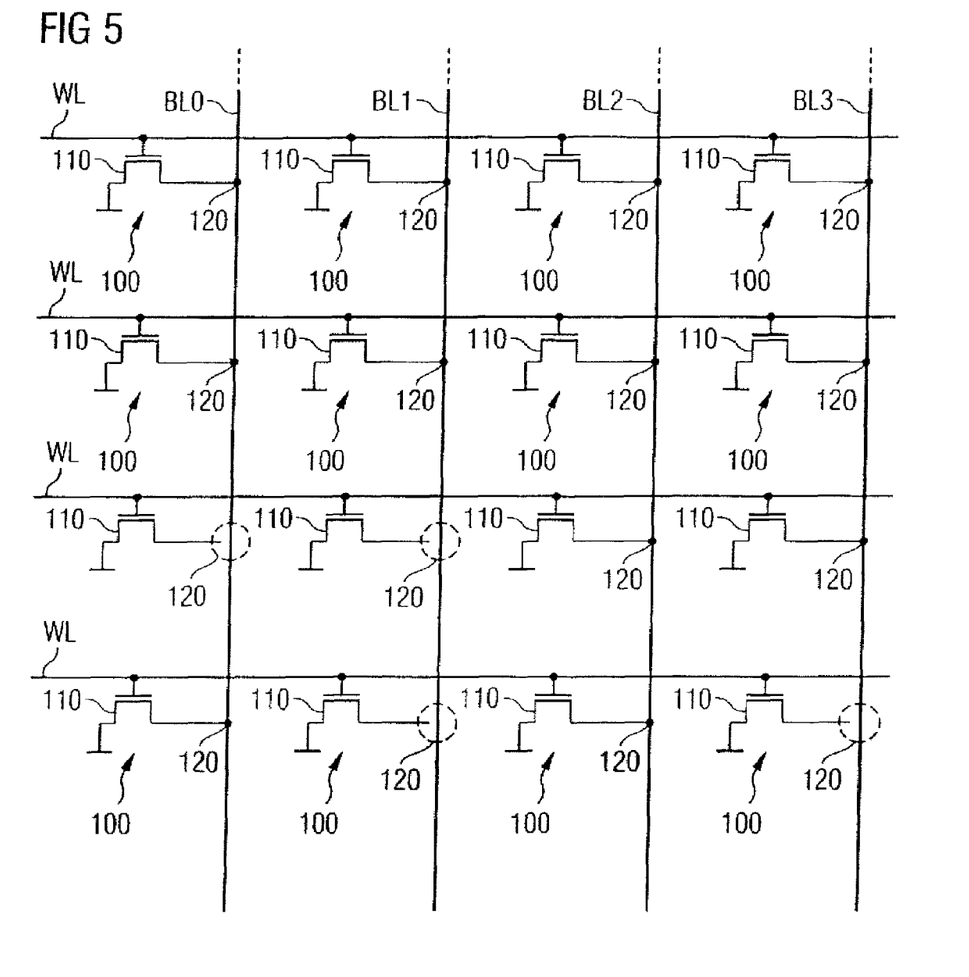
FIG. 5 shows an example of an arrangement of ROM memory cells.

FIG. 5 shows, exemplarily, a portion of a memory cell arrangement such as that used in a typical ROM memory according to the prior art. The memory cells 100 are arranged in the form of an array, and are addressable through wordlines WL and bitlines BL0, BL1, BL2, BL3. Each of the memory cells 100 comprises a switching means 110 in the form of an NMOS transistor. Alternatively, PMOS transistors or other forms of switching means may be used. One input of the switching means 110 is in each case connected to a fixed potential, in this case a negative supply voltage of the memory. The other input of the switching means 110 is selectively connected to one of the bitlines BL0, BL1, BL2, BL3, depending on which state has been assigned to the memory cell 100. More precisely, this means that, for a first state of the memory cell 100, a connection to the bitline BL0, BL1, BL2, BL3 is provided at a connection point provided for that purpose, whilst, for a second state of the memory cell 100, the connection to the bitline BL0, BL1, BL2, BL3 is not provided. In essence, read-out of the memory is effected in that the bitlines BL0, BL1, BL2, BL3 are connected for a certain period to a further fixed potential, in this case to a positive supply voltage of the memory, in order to effect a precharging of the bitlines BL0, BL1, BL2, BL3. For the actual read-out process, a signal is then applied to one of the wordlines WL that is connected to the control inputs of the switching means 110, in such a way that the switching means 110 activated through this wordline WL connect their two inputs in a conductive manner. A connection of the bitline BL0, BL1, BL2, BL3 to the negative supply voltage is thus established for each of the memory cells 100 that is activated through the wordline WL and to which the first state has been assigned, such that the bitline BL0, BL1, BL2, BL3 is discharged. Consequently, the state of the memory cells 100 can be evaluated through measurement of the charge state of the bitline BL0, BL1, BL2, BL3.

In the case of large storage devices, it is usual to organise the memory cells in rows and columns. In this case, a plurality of bitlines, for example 8, 16, 32 or 64, are combined to form one column and use a common output structure via which the evaluation of the bitlines is effected, the invention being described exemplarily in the following, for simplicity, with reference to 8 bitlines. In order to render this possible, column multiplexers are used, which respectively further connect one of the bitlines supplied to them to the output structure, in dependence on a control signal.

A problem of the ROM storage devices according to the prior art described above, however, is that an unfavourable distribution of the states of memory cells that are assigned to a bitline can result in a high additional load for this bitline. This problem may be explained as follows, with reference to FIG. 5: For the memory cells 100, to which the first state has been assigned, a connection to the negative supply voltage is provided via the switching means 110. These connections result in, for example, an additional capacitive load and additional leakage currents. The more the first state has been assigned to the memory cells 100 belonging to the bitline, the higher is this load.

In view of the problem stated above, there is known from U.S. Pat. No. 6,424,556 B1 the practice of performing a so-called bitline inversion coding, in which the assignment of the first state and of the second state of the memory cells to the first and second binary value is inverted, in order to achieve a lesser capacitive load for a bitline or for certain memory areas. This would mean, for example, that a bitline, for which provision is made whereby the majority of the memory cells store the binary value "0", is used with an inverted assignment, as a bitline the majority of whose memory cells store the binary value "1". In this way, it is possible to achieve a situation for both cases, i.e. a majority storage of a "0" or a majority storage of a "1", in which the majority of the memory cells of the respective bitline assumes the state which means the least additional load for the bitline.

In the read-out of the memory cells, it is consequently necessary to take into account whether the instantaneously evaluated bitline is based on an inverted or non-inverted assignment of the state of the memory cells to the binary values "0" and "1". This is typically effected in that there are additionally stored in the storage bitline inversion coding data which define whether the bitlines are respectively based on the non-inverted assignment or the inverted assignment.

Figure 6:
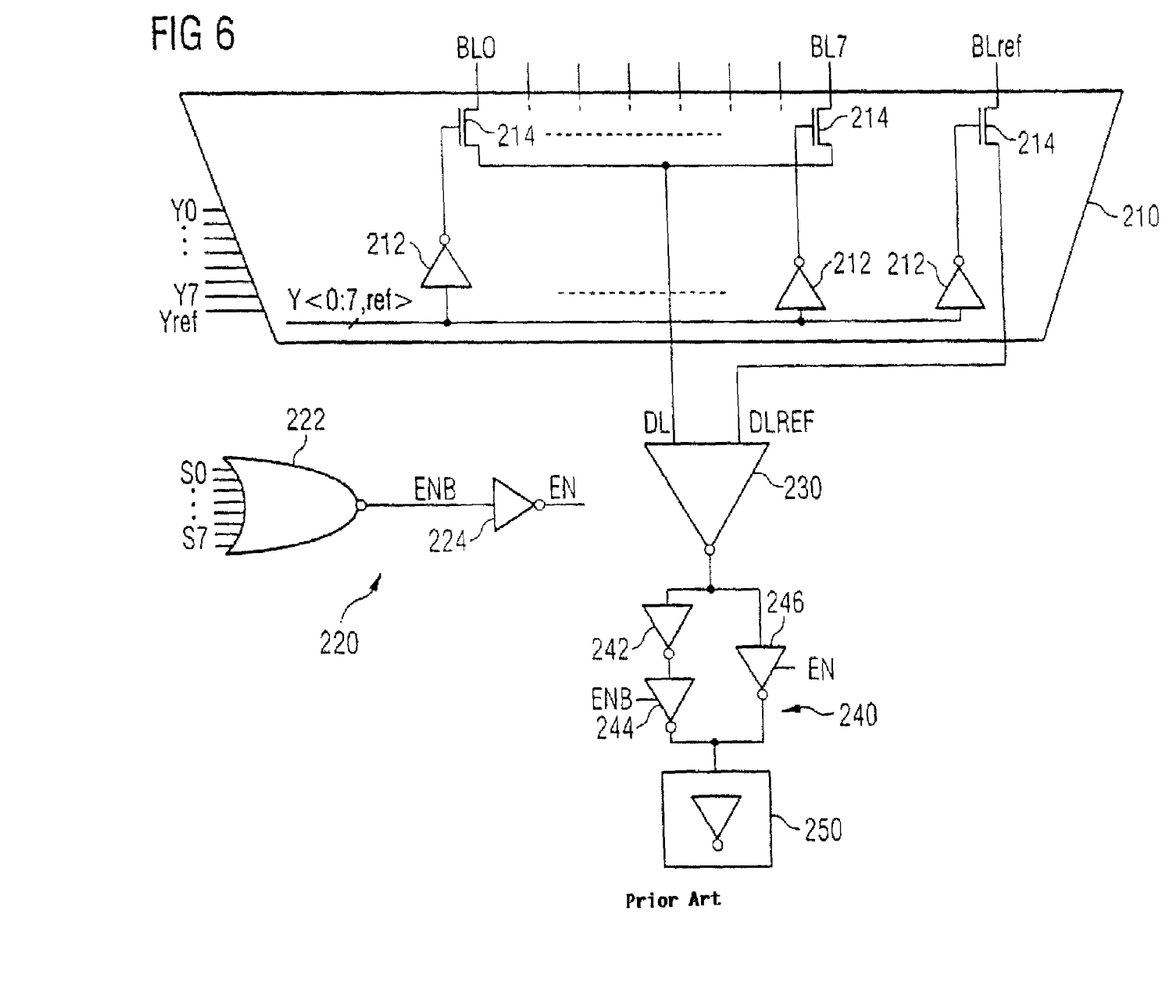
FIG. 6 shows an arrangement for the decoding of data stored using a bitline inversion coding, according to the prior art.

An example of a circuit arrangement for the read-out of a storage with a bitline inversion coding according to the prior art is represented in FIG. 6. Bitlines BL0-BL7 of an arrangement of memory cells (not shown) are supplied to a column multiplexer 210. The column multiplexer 210, in dependence on a control signal having sub-signals Y0-Y7, forwards the signal of respectively one of the bitlines BL0-BL7 to a data line DL. For this purpose, the column multiplexer 210 comprises switching means 214 in the form of NMOS transistors. The switching means 214 are respectively connected, at an input, to a corresponding bitline BL0-BL7 and, at their other input, to the data line DL. The switching means 214 are activated via a respective inverter 212 of one of the sub-signals Y0-Y7 of the control signal of the column multiplexer 210.

At a further input, a reference bitline BLref is supplied to the column multiplexer 210. A switching means 214, which likewise consists of an NMOS transistor, forwards the signal of the reference bitline BLref to a reference data line DLREF. Like the switching means 214 of the bitlines BL0-BL7, the switching means 214 of the reference bitline BLref is activated, via an inverter 212, through a reference bitline control signal Yref.

The data line DL and the reference data line DLREF are supplied to an inverting measuring amplifier 230, which is of differential design and measures the charge state of the bitline BL0-BL7 connected to the data line DL relative to the charge state of the reference bitline BLref.

The output signal of the measuring amplifier 230 is supplied to an inverting means 240. The inverting means 240 comprises two signal paths, of which a first signal path comprises two series-connected inverters 242, 244 and a second signal path comprises one inverter 246. One of the inverters 242, 244 of the first signal path is activated through a control signal ENB, such that the first signal path can be interrupted in dependence on the selection signal ENB. The inverter 246 of the second signal path is activated through a selection signal EN, such that the second signal path can be interrupted in dependence on the control signal EN. The outputs of the first signal path and of the second signal path are brought together to form one signal output of the inverting means 240. The signal output of the inverting means 240 is connected to an output register 250, which is likewise of an inverting design.

Through an appropriate activation of the inverting means 240 by means of the selection signals ENB and EN, a situation is achieved in which either the first signal path from the signal measuring amplifier 230 to the output register 250 is switched-through, or the second signal path from the signal measuring amplifier 230 to the output register 250 is switched-through. Since the first signal path provides for a double inversion of its input signal, whereas the second signal path provides for a single inversion of its input signal, the value read out via one of the bitlines BL0-BL7 can thus be selectively inverted through the inversion means 240.

The selection signals ENB and EN for the inverting means 240 are generated by a control logic 220 which, in dependence on input signals S0-S7, generates the selection signals ENB and EN in such a way that they are complementary to one another. The input signals S0-S7 are respectively assigned to one of the bitlines BL0-BL7. For a bitline BL0-BL7 having an inverted assignment, the input signal S0-S7 is provided by the corresponding sub-signal Y0-Y7 of the column multiplexer 210. For bitlines BL0-BL7 having a non-inverted assignment, the input signal S0-S7 is derived from a fixed potential, which differs from the signal level used in the case of the sub-signals Y0-Y7 used in the case of the sub-signals Y0-Y7 for activating the switching means 214. The input signals S0-S7 thus correspond to the bitline inversion coding data.

The input signals S0-S7 are supplied to a logic gate 222 which, depending on whether one of the input signals S0-S7 has a value differing from the fixed potential, first generates the control signal ENB as an output signal. The control signal ENB is then further supplied to an inverter 224, the output signal of which then constitutes the control signal EN. In this case, the logic gate 222 is a NOR gate.

The known solution, described above, for the decoding of data stored using a bitline inversion coding thus requires a complex logic circuit, which means a large amount of control resource and increases the required area for realization on a semiconductor chip. Furthermore, power consumption of the storage is also increased, and the speed of read-out operations and the time control of read-out operations of the storage are impaired. This is due to, inter alia, the substantial additional load to which the sub-signals of the control signal of the column multiplexer 210 are subjected. Consequently, the advantages of bitline inversion coding cannot be exploited to the full extent.

BRIEF SUMMARY

The object of the present invention consists in providing a method and a storage device for the permanent storage of data, which avoid the problems, described above, of the prior art and which, in particular, render possible an effective decoding of data stored using a bitline inversion coding.

According to one embodiment of the invention, the permanent storage of data is effected in a storage device having a plurality of memory cells which can be read out via bitlines. For the purpose of reading out the memory cells, a plurality of the bitlines are connected to an output structure via a multiplexer means. The multiplexer means may be, in particular, a column multiplexer which enables a plurality of bitlines, combined into one column, to be evaluated by means of a single output structure. In order for a first value, e.g. a binary "0", to be permanently stored in one of the memory cells, a first state is assigned to this memory cell. In order for a second value, e.g. a binary "1", to be permanently stored in one of the memory cells, a second state is assigned to the memory cell. This is preferably effected in that an additional conductive connection is provided in the memory cell, for example between a switching means and one of the bitlines, during the production of the storage device.

In order to minimize the load on the bit lines, provision is made according to one embodiment of the invention whereby a bitline inversion coding is used. This means that, in each case, either a non-inverted assignment of the first state and of the second state to the first value and the second value, or an inverted assignment of the first state and of the second state to the first value and the second value, is used for the bitlines in order to store data, i.e. the values, in the memory cells. The assignment is preferably selected in such a way that, for each of the bitlines, that state which means the least additional load for the bitline is assigned to at least half of the associated memory cells. The additional load on the bitlines is thus minimized through use of bitline inversion coding.

In read-out of the memory cells, decoding of the data stored using bitline inversion coding is performed. For this purpose, the values read out of the memory cells are selectively inverted for those bitlines for which the assignment has been inverted, in order to obtain a result value which corresponds to the non-inverted assignment of the first state and of the second state to the first value and to the second value. This is effected in dependence on bitline inversion coding data which are likewise stored in the storage device.

Provision is made according to the invention whereby the bitline inversion coding data are stored in the structure of the multiplexer means. This means, specifically, that the multiplexer means for the bitlines connected thereto comprises a respective connection point at which connections can be selectively provided. The connection points are connected through switching means, in dependence on a control signal of the multiplexer means, to a common nodal point of the multiplexer means. The connection points can therefore be connected to the common nodal point in the same way in which the multiplexer means connects respectively one of the bitlines to a data line at the output of the multiplexer means. In order to store the bitline inversion coding data, a connection to a predefined potential is provided at the connection points in dependence on whether or not the assignment is inverted for the corresponding bitline.

In this way, a situation is achieved in which, when the multiplexer means connects one of the bitlines, at its input, to the data line, at its output, the connection point belonging to this bitline is simultaneously connected to the common nodal point. The signal level at the common nodal point is thus dependent on whether or not the connection to the predefined potential has been provided for this bitline at the connection point, so that the common nodal point is suitable for read-out of the bitline inversion coding data. Therefore, according to the invention, a control signal for the selective inversion of the values read out from the memory cells is generated in dependence on the signal level at the common nodal point. This is preferably effected in that a series connection, consisting of a first and a second inverter, is connected to the common nodal point, a first selection signal being able to be tapped at the output of the first inverter and a second selection signal being able to be tapped at the output of the second inverter. The first and the second selection signals are thus complementary to one another, and are suitable for selectively opening either a first signal path or a second signal path for the value read out from the memory cells. In this case, the first and the second signal paths differ in that, in one of the signal paths, an inversion which is additional relative to the other signal path is effected.

The read-out of the bitline inversion coding data is preferably effected in that, prior to the actual read-out operation, the common nodal point is temporarily connected to a further predefined potential, in order to effect a precharging of the common nodal point. In this case, this further predefined potential differs from that in respect of which the connection to the predefined potential is provided at the connection points in the case of storage of the bitline inversion coding data. This means that, if such a connection exists for the instantaneously read-out bitline, the common nodal point is discharged during the actual read-out operation, whereas, in the other case, the charge of the common nodal point continues to exist. In this way, the bitline inversion coding data can be read out at high speed.

The provision of the connection at the connection points is preferably effected either to the predefined potential or to the further predefined potential, depending on whether or not the assignment has been inverted for the corresponding bitline. In this way, unwanted discharging of the common nodal point is counteracted. The precharging of the common nodal point is preferably effected via a precharging switching means which is designed to complement switching means of the multiplexer means, which latter switching means respectively connect one of the bitlines at the input of the multiplexer means to the data line at the output of the multiplexer means, such that it is ensured that, when the polarity of the control signal is the same, the precharging is effected between two read-out operations in each case.

According to a preferred exemplary embodiment, a reference bitline is provided, which is likewise supplied to the multiplexer means and, from the latter, is connected, in dependence on a reference bitline control signal, to a reference data line which constitutes an output of the multiplexer means. In this case, a measuring amplifier of the output structure is preferably of differential design, a first input of the measuring amplifier being selectively connected to one of the bitlines through the multiplexer means, and a second input of the measuring amplifier being connected to the reference bitline through the multiplexer means. The precharging switching means is then preferably activated through the reference bitline control signal. Alternatively, and particularly if no reference bitline is provided, the precharging switching means may be activated in dependence on a control signal of the measuring amplifier of the output structure. Such a control signal separates the signal output of the measuring amplifier from the bitlines between two read-out operations of the memory, such that the charge of the bitlines is maintained until the actual read-out operation. The precharging switching means can therefore be activated through this control signal, with a small amount of resource, in such a way that a precharging of the common nodal point is effected between two read-out operations in each case.

A storage device, according to one embodiment of the invention, for the permanent storage of data comprises a multiplicity of memory cells which can be read out via bitlines, a plurality of the bitlines being connected to an output structure, via a multiplexer means, for the purpose of read-out of the memory cells. The memory cells are designed to assume in each case either a first state or a second state, in order permanently to store a first value or a second value. As already mentioned, a bitline inversion coding is used, i.e. either a non-inverted assignment of the first state and of the second state of the memory cells to the first value and the second value, or an inverted assignment of the first state and of the second state to the first value and the second value, is used.

For the purpose of decoding the data stored using bitline inversion coding, the storage device furthermore comprises inverter means which are designed selectively to invert, for those bitlines for which the inverted assignment is used, the value read out from the memory cells, in order to obtain in this way a result value which corresponds to the non-inverted assignment of the first state and of the second state to the first value and to the second value. According to the invention, the multiplexer means comprises, for the bitlines connected thereto, a respective connection point at which a connection to a predefined potential is provided, depending on whether or not the assignment is inverted for the bitline. The multiplexer means furthermore comprises switching means which are designed to connect the connection points to a common nodal point of the multiplexer means in dependence on a control signal of the multiplexer means, in order to generate a control signal for the inverter means in dependence on the signal level at the common nodal point. The storage device is preferably designed to execute the method according to the invention described above.

The present invention enables data stored using bitline inversion coding to be read out and decoded with an extremely small amount of resource. Thus, the solution according to the invention combines a small amount of resource and low costs with a high performance of the storage device. According to the invention, the storage of the necessary bitline inversion coding data is effected within the multiplexer means, e.g. within a column multiplexer. No separate control is required for the decoding. Furthermore, compared with a solution without bitline inversion coding, the solution according to the invention does not require any additional signals or any significant additional power consumption of the storage device. The additional load on the control signals due to the decoding is minimal. Furthermore, compared with a solution without bitline inversion coding, it is not necessary to re-dimension signal buffers used in the data path. Moreover, the solution according to the invention is scalable for different sizes of column multiplexer.

The present invention thus renders possible a particularly advantageous use of the concept of bitline inversion coding, wherein the advantages achieved thereby in respect of power consumption and speed are not offset by a complex decoding. The invention is particularly suitable for ROM storage devices, but it can also be used for other types of nonvolatile storage devices such as, for example, MRAM (Magnetic Random Access Memory) or flash memories.

BRIEF DESCRIPTION OF THE DRAWINGS

The invention is described in detail in the following with reference to preferred exemplary embodiments and the appended drawings.

DETAILED DESCRIPTION OF THE DRAWINGS

Figure 1:
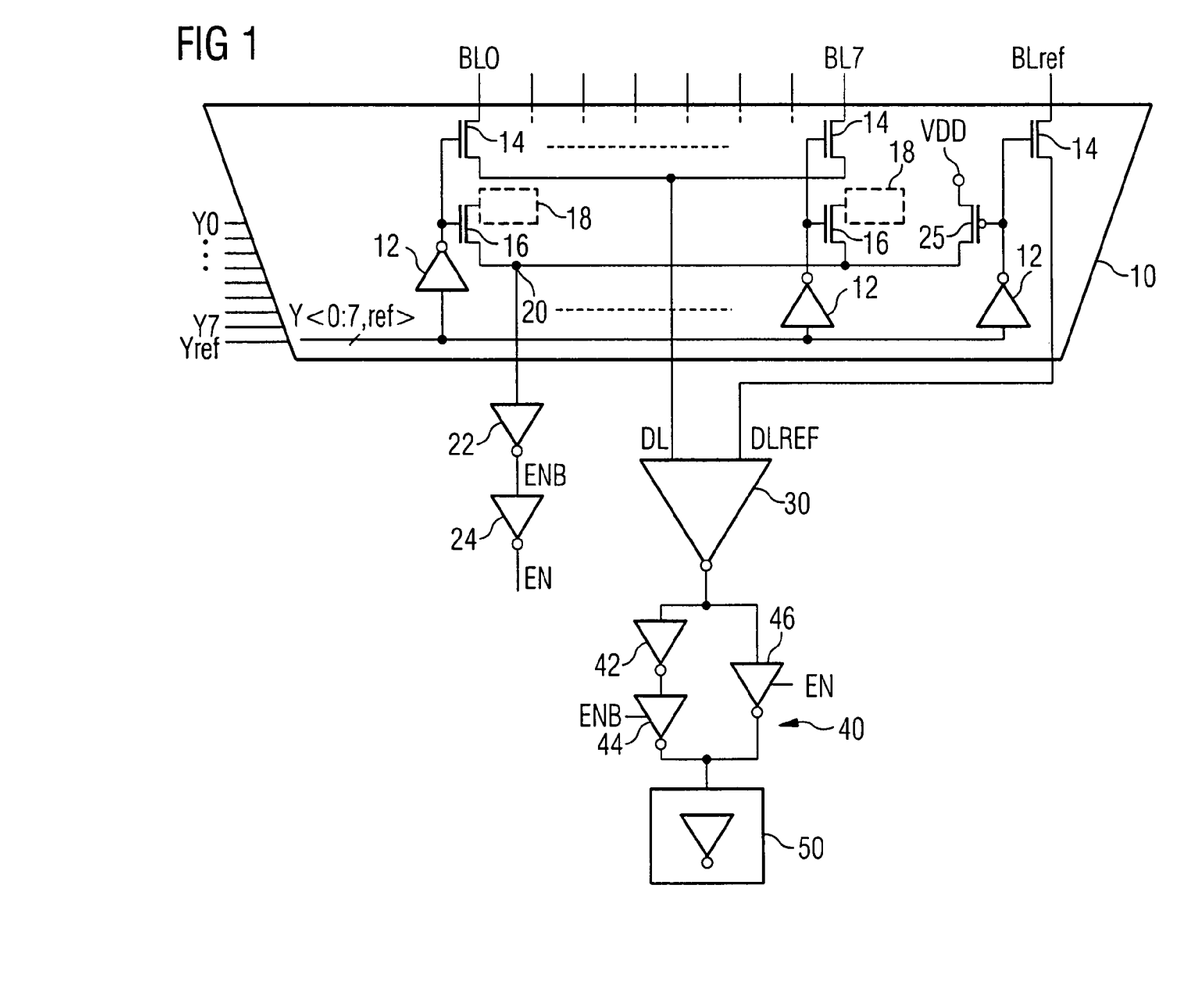
FIG. 1 shows an exemplary embodiment of a circuit arrangement for the decoding of data stored using a bitline inversion coding, in a storage device according to the invention.

FIG. 1 shows a circuit arrangement for the decoding of data stored using a bitline inversion coding. The circuit arrangement is part of a storage device, which comprises a multiplicity of memory cells which are addressable through wordlines and bitlines. The memory cell arrangement itself is not represented in FIG. 1. In this case, it may be an arrangement of ROM memory cells such as, for example, that represented in FIG. 5. Alternatively, other types of memory cells, for example MRAM memory cells or flash memory cells, are also possible. In the following, it is assumed that the arrangement of memory cells is organized in rows and columns, a certain number of bit lines being in each case combined to form one column.

The circuit arrangement represented in FIG. 1 comprises a column multiplexer 10, to which eight bitlines BL0-BL7 are supplied. The column multiplexer 10 is designed to connect respectively one of the bitlines BL0-BL7 to a data line DL at the output of the column multiplexer in dependence on a control signal. For this purpose the column multiplexer 10 comprises, for each of the bitlines BL0-BL7, a respective switching means 14 in the form of an NMOS transistor. For the purpose of activating the switching means 14, the control signal of the column multiplexer 10 comprises sub-signals Y0-Y7, which respectively activate one of the switching means 14. This is effected via a respective inverter 12.

Additionally supplied to the column multiplexer 10 is a reference bitline BLref, which is connected to a reference data line DLREF at the output of the column multiplexer 10 in dependence on a further sub-signal Yref of the control signal of the column multiplexer 10. For this purpose, the column multiplexer 10 comprises a further switching means 14, which is likewise designed as an NMOS transistor. This further switching means 14 is activated, via an inverter 12, through the sub-signal Yref of the control signal of the column multiplexer 10. In the following, the sub-signal Yref is referred to as a reference bitline control signal.

In addition, the column multiplexer 10 comprises further switching means 16, which are respectively assigned to one of the bitlines BL0-BL7 and respectively connect a connection point 18 to a nodal point which is common to all switching means 16. The switching means 16 are of the same structural design as the switching means 14, i.e. designed as NMOS transistors. The switching means 16 are activated through the same control signals as the switching means 14 assigned to the corresponding bitline BL0-BL7. In addition, a precharging switching means is provided, which connects the common nodal point 20 to a positive supply voltage VDD of the circuit arrangement. The precharging switching means 25 is designed as a PMOS transistor to complement the switching means 14 and 16. The precharging switching means 25 is activated through the same control signal as the switching means 14 for the reference bitline BLref, i.e. in dependence on the reference bitline control signal Yref.

The data line DL and the reference data line DLREF, which constitute outputs of the column multiplexer 10, are supplied to a measuring amplifier 30. During a read-out operation of a storage cell, the measuring amplifier 30 measures the charge state of the bitline BL0-BL7 selected by the column multiplexer 10, relative to the reference bitline BLref. The output of the measuring amplifier 30 is supplied to an inverter means 40. The inverter means 40 comprises a first signal path, having an inverter 42 and an inverter 44, and a second signal path, having an inverter 46. In this case, the first and the second signal paths are connected in parallel between a signal input and a signal output of the inverter means 40. Since, in comparison with the second signal path, the first signal path has an additional inverter, a signal which passes through the first signal path is inverted relative to a signal which passes through the second signal path. The inverter 44 is designed to interrupt the first signal path in dependence on a first selection signal ENB. Accordingly, the inverter 46 is designed to interrupt the second signal path in dependence on a second selection signal EN. The output signal of the inverter means 40 is supplied to an output register 50.

The measuring amplifier 30, the inverter means 40 and the output register 50 together constitute an output structure which serves to read out data from the memory cells, this output structure being used jointly, by means of the column multiplexer, by a plurality of bitlines BL0-BL7. In this case, both the signal output of the measuring amplifier 30 and the signal output of the output register 50 are of an inverting design. In total, a four-fold inversion of the value read out from the memory cell is thus obtained in the case of passage through the first signal path of the inverter means 40. By contrast, in the case of passage through the second signal path of the inverter means 40, a three-fold inversion of the value read out from the memory cell is obtained, so that a result value at the signal output of the output register 50 is inverted relative to the value read out from the memory cell.

For the purpose of generating the first selection signal ENB and the second selection signal EN, i.e. for the purpose of generating a control signal for the inverter means 40, a series connection, consisting of a first inverter 22 and a second inverter 24, is connected to the common nodal point 20 of the column multiplexer 10. The charge state in the common nodal point 20 is measured by the first inverter 22, the output signal of the first inverter 22, which output signal constitutes the first selection signal ENB, being generated in such a way that an interruption of the second signal path by the inverter 44 is effected if the charge state in the common nodal point 20 does not correspond to the positive supply voltage VDD. The second selection signal EN is tapped at the signal output of the second inverter 24, and is complementary to the first selection signal ENB, such that, in this case, the inverter 46 does not interrupt the second signal path. In the event that the charge state in the common nodal point 20 does not correspond to the positive supply voltage VDD, the result value at the signal output of the output register 50 is thus inverted relative to the value read out from the memory cell.

For the inverse case, in which the charge state in the nodal point 20 corresponds to the positive supply voltage VDD, the selection signal ENB and EN assume values which are inverted relative to the previously described case, such that the second signal path of the inverting means 40 is now interrupted, whilst the first signal path is not interrupted. In this case, the result value at the signal output of the output register 50 is not inverted relative to the value read out from the memory cell.

Described in the following is a method for the permanent storage of data which is based on a bitline inversion coding and on the previously described circuit arrangement for decoding.

For the purpose of permanent storage of either a first value or a second value in a memory cell, a first or a second state is assigned to this memory cell. This is effected in that, in the memory cell, a connection to the bitline is established for the first state, but this is not effected for the second state. In the following, it is assumed that, according to a non-inverted assignment, the first state is assigned to a binary value "0", whilst the second state is assigned to a binary value "1". Depending on the data stored in the arrangement of memory cells, it is normally to be expected that, for the memory cells that respectively belong to a bitline BL0-BL7, the number of memory cells which are to store a binary value of "0" exceeds those of the memory cells which are to store a binary value of "1", or vice versa. In this case, unfavourable configurations may ensue in respect of the additional load for the bitline BL0-BL7. Therefore, for that bitline for which an unfavourable distribution of the number of memory cells in the first state and in the second state would ensue in the case of the non-inverted assignment, the assignment of the first state and of the second state to the binary values "0" and "1" is inverted. In this way, the additional load on the bitlines can be minimized.

In order that the values stored in the memory cells can be read out correctly at the signal output of the output register 50, it is necessary, for those bitlines BL0-BL7 for which the assignment of the first state and of the second state of the memory cells to the binary value "0" and to the binary value "1" has been inverted, that the value read out from the memory cells be inverted. There are stored for this purpose bitline inversion coding data which indicate, for each of the bitlines BL0-BL7 connected to the column multiplexer 10, whether or not the assignment has been inverted for the bitline BL0-BL7. This is effected in that, at the connection points 18 of the column multiplexer 10, a connection to a predefined potential is selectively established for those bitlines BL0-BL7 for which the assignment has been inverted, whilst, for the other bitlines BL0-BL7, a connection is established to a further predefined potential. This is preferably effected in the same process step in which the connections are also established in the memory cells, in order to respectively assign to the latter either the first or the second state. In the case of the example shown in FIG. 1, the predefined potential is a negative supply voltage VSS, whilst the further predefined potential is the positive supply voltage VDD.

In the case of ROM memory cells, the provision of the connections, both in the memory cells and at the connection points 18, is preferably effected by means of vias between two conducting layers. This technique has long been known to the person skilled in the art, and is also described in, for example, the previously mentioned U.S. Pat. No. 6,424,556 B1, to which reference is made in this respect. If memory cells of a different type are used, for example MRAM memory cells or flash memory cells, these connections may also be provided in another manner, according to the realization of the memory cells.

In the case of the example represented in FIG. 1, the common nodal point 20 is connected to the positive supply voltage VDD for a certain interval of time, between two read-out operations in each case, through the precharging switching means 25, in order to effect a precharging of the common nodal point 20. This precharging is complementary to that of the bitlines BL0-BL7, which are precharged, between two read-out operations, to a potential corresponding to the negative supply voltage VSS.

Prior to the actual read-out operation, the common nodal point 20 is thus precharged to a potential corresponding to the positive supply voltage VDD. If, during the read-out operation, there is then activated one of the bitlines BL0-BL7, for which the assignment of the first state and of the second state of the memory cells to the binary value "0" and to the binary value "1" has been inverted and the connection to the predefined potential has thus also been provided at the corresponding connection point 18, during the read-out operation the common nodal point 20 is connected, through the corresponding switching means 16 of the bitline BL0-BL7, to the predefined potential to which the connection has been established at the connection point 18. In the case of the example represented in FIG. 1, the predefined potential is the negative supply voltage VSS, with the result that the common nodal point 20 is discharged. During the read-out operation, the first inverter 22 therefore measures, at the common nodal point 20, a potential which differs from the positive supply voltage VDD, with the result that the inverter means 40 are activated, as explained above, in such a way that the first signal path is interrupted and the second signal path is opened. Overall, a situation is thus achieved in which the result value present at the signal output of the output register 50 is inverted relative to the value read out from the memory cell.

If, during the read-out operation, there is activated a bitline B0-B7 for which the assignment has not been inverted, there exists at the corresponding connection point 18 a connection to the further predefined potential, i.e. to the positive supply voltage VDD, with the result that the common nodal point 20 maintains its charge state and, consequently, overall there is also no inversion of the result value available at the signal output of the output register 50 relative to the value read out from the memory cell.

In the case of the example represented in FIG. 1, the measurement of the charge state of the activated bitline BL0-BL7 is effected relative to a reference bitline BLref. For the reference bitline BLref, the state of the memory cells connected thereto is fixed. The reference bitline BLref is precharged and activated in the same manner as the bitlines BL0-BL7. However, its charge state during the actual read-out operation is known, and can therefore be used advantageously as a reference value. This reference value has the advantage, in particular, that it is subject to the same disturbances and external influences as the values read out via the bitlines BL0-BL7.

During each read-out operation, the switching means 14, which is activated through the reference bitline control signal Yref, connects the reference bitline BLref to the reference data line DLREF, irrespective of which of the bitlines BL0-BL7 is activated during the read-out operation. For this reason, in the case of the example represented in FIG. 1, the reference bitline control signal is also used, between two read-out operations in each case, to connect the common nodal point 20 to the positive supply voltage VDD, via the precharging switching means 25, in order to effect the precharging of the common nodal point 20.

Compared with a solution which does not provide for a bitline inversion coding, the read-out of the bitline inversion coding data which are integrally stored in the column multiplexer 10 by means of the connections provided at the connection points 18 thus does not require any additional control resource. There is also no significant additional loading for the control signals Y0-Y7 and Yref. In total, all that is required is an additional switching means 16 for each of the bitlines BL0-BL7, and the precharging switching means 25. The low complexity of the circuit arrangement is based, inter alia, on the fact that, for the purpose of storing the bitline inversion coding data, the selective provision of connections to the predefined potential and to the further predefined potential is effected, not at control connections of switching means, but at one of the two inputs of the switching means 16, i.e., in the present example, at the source connection of the NMOS transistors 16.

To enable a slight discharge of the common nodal point 20 to be compensated following the precharging, the first inverter 22 has a threshold value which is selected such that it is non-symmetrical in relation to the predefined potential and the further predefined potential. More precisely, this means that the interval between the threshold value and the predefined potential is selected such that it is less than the interval to the further predefined potential. In this way, a discharge of the common nodal point 20 can be compensated from the further predefined potential towards the predefined potential.

Figure 2:
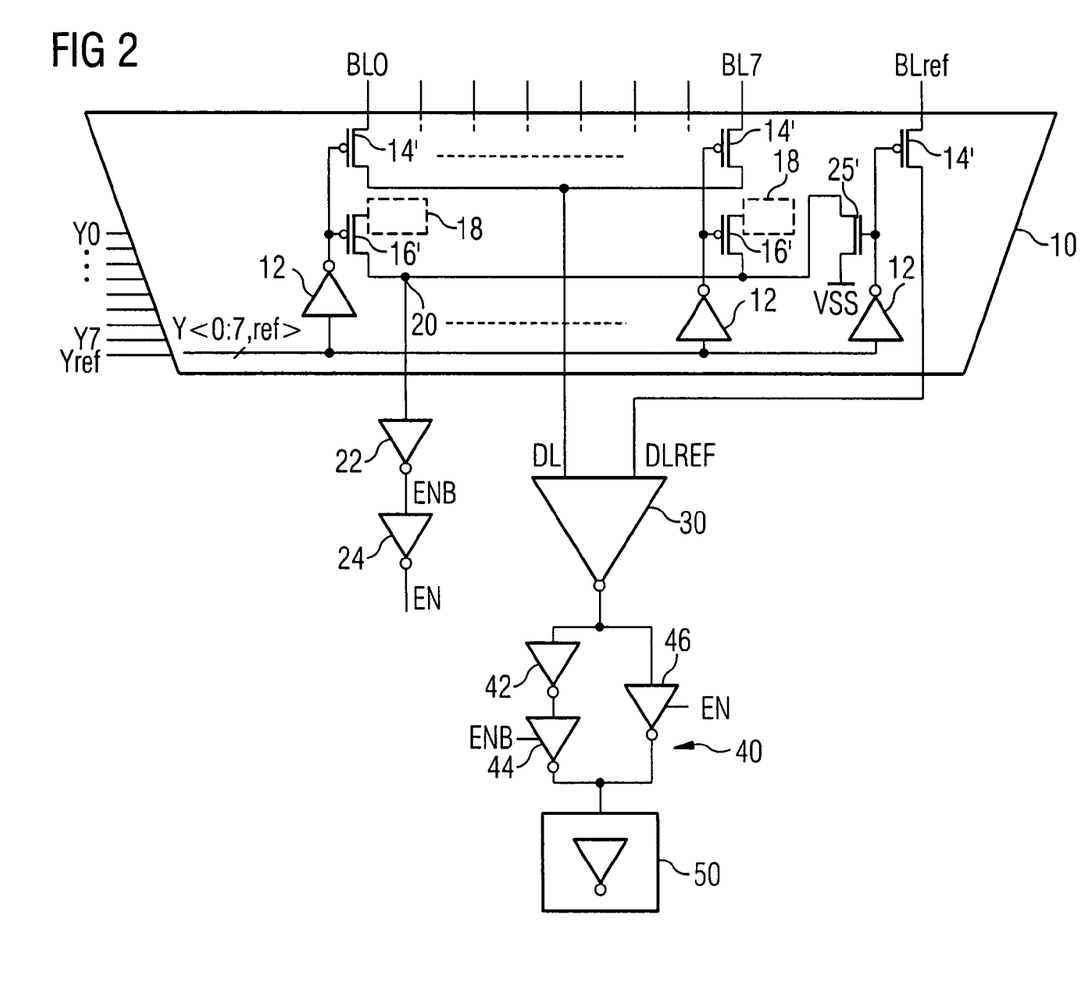
FIG. 2 shows a further exemplary embodiment of a circuit arrangement for the decoding of data stored using a bitline inversion coding, in a storage device according to the invention.
Figure 3:
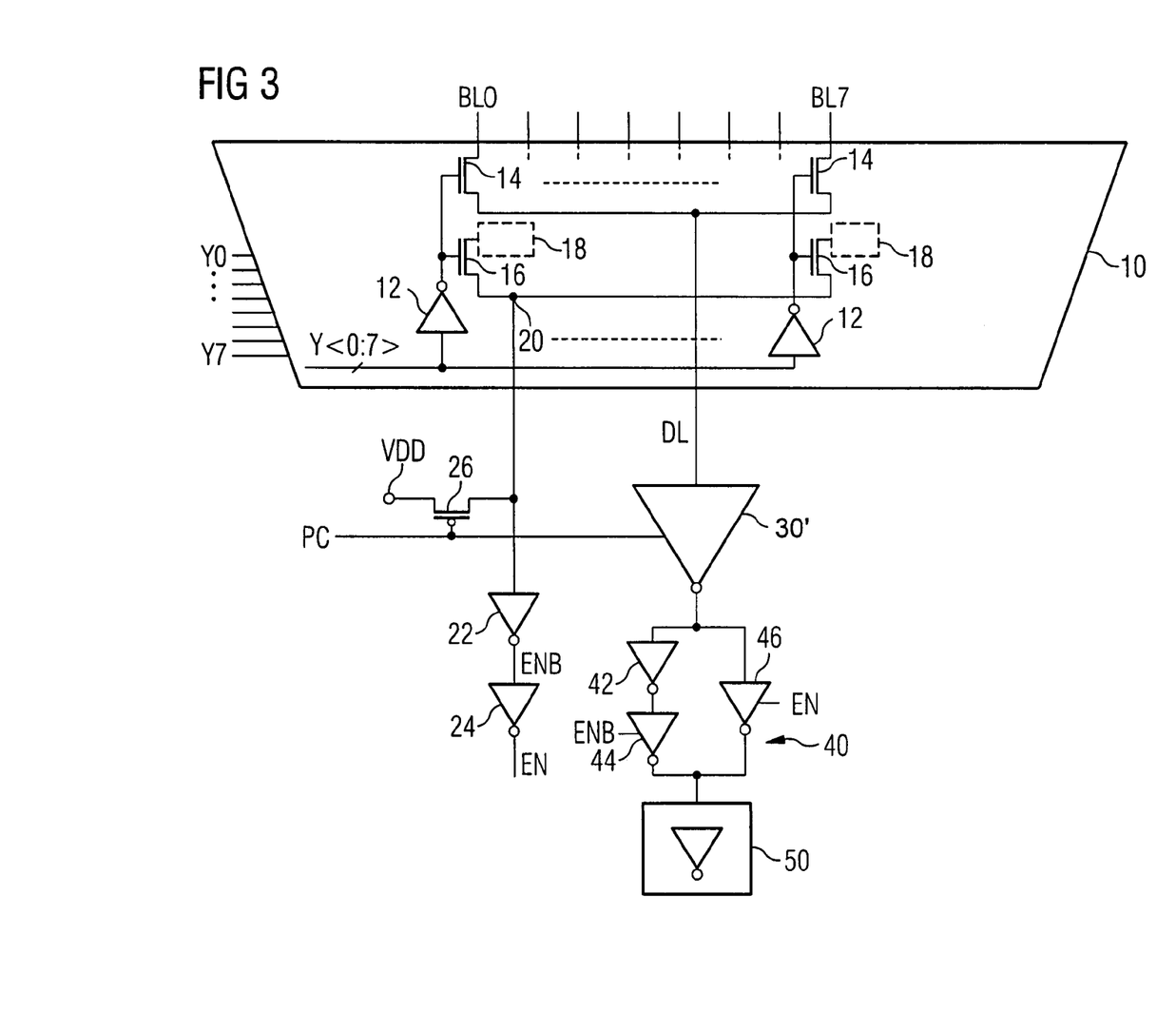
FIG. 3 shows a further exemplary embodiment of a circuit arrangement for the decoding of data stored using a bitline inversion coding, in a storage device according to the invention.
Figure 4:
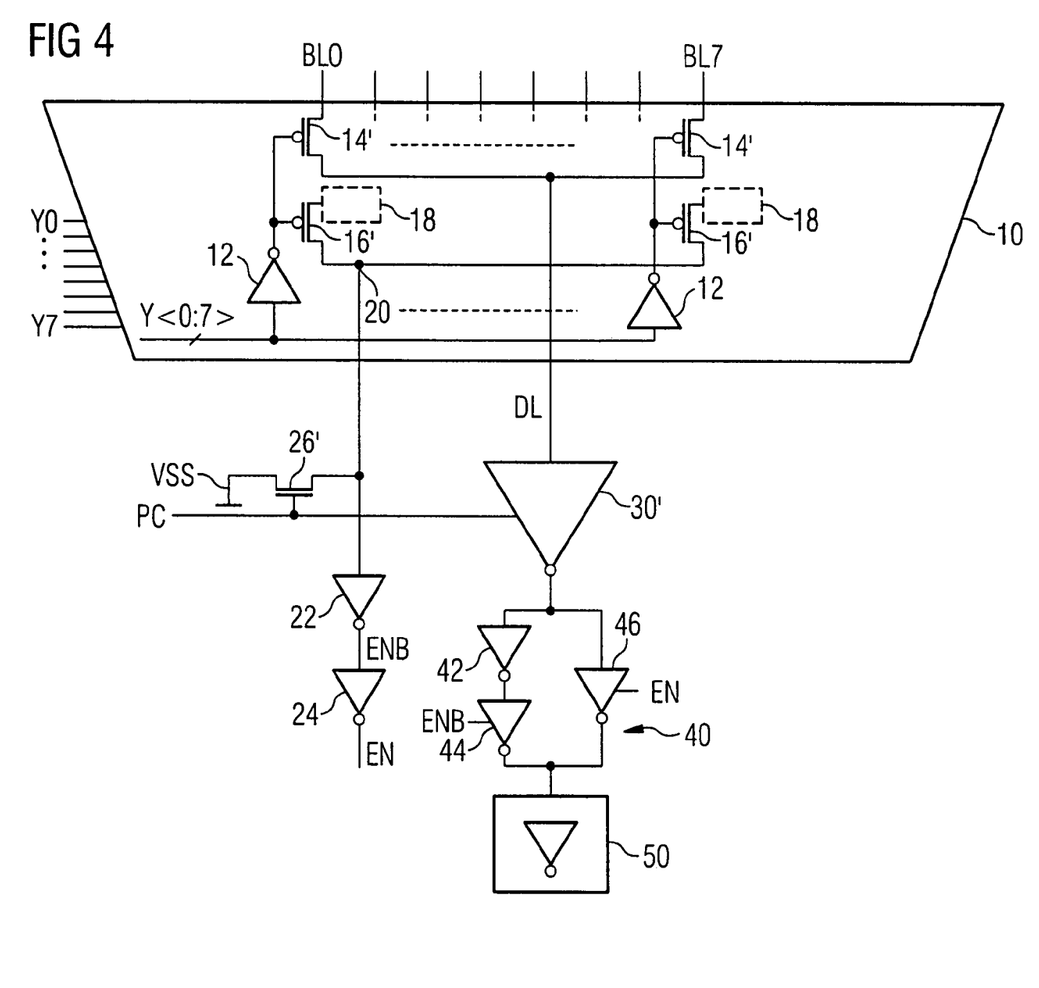
FIG. 4 shows a further exemplary embodiment of a circuit arrangement for the decoding of data stored using a bitline inversion coding, in a storage device according to the invention.

FIGS. 2 to 4 show alternative realizations of the circuit arrangement of FIG. 1. Elements of these figures which correspond to those of FIG. 1 are denoted by the same references throughout. Explanation of these elements is not repeated in the following, and reference is made to the above description relating to FIG. 1.

The example of a circuit arrangement, represented in FIG. 2, for the decoding of data stored using a bitline inversion coding corresponds in essence to the example from FIG. 1. In contrast to FIG. 1, however, switching means 14' and 16' of the column multiplexer 10 are realized as PMOS transistors. Otherwise, the switching means 14' and 16' correspond to those of the example from FIG. 1. Accordingly, precharging switching means 25' are realized, as NMOS transistors, in a structural design complementing the switching means 14' and 16'. In the case of the example represented in FIG. 2, the bitlines BL0-BL7 and the reference bitline BLref are precharged, between two read-out operations, to a potential corresponding to the positive supply voltage VDD. The common nodal point 20 is precharged to a potential corresponding to the negative supply voltage VSS. For this purpose, the precharging switching means 25' connect the common nodal point 20 to the negative supply voltage VSS. The storage of the bitline inversion coding data is effected in that, at the connection points 18, in the manner previously described, a connection is selectively provided either to the predefined potential or to the further predefined potential, which potentials being, in the case of this example, the positive supply voltage VDD and the negative supply voltage VSS respectively.

The example of a circuit arrangement, represented in FIG. 3, for the decoding of data stored using a bitline inversion coding differs from the example represented in FIG. 1 in that no reference bitline BLref is provided. Accordingly, the measuring amplifier 30' is not of a differential design, and has only one input, to which is supplied the data line DL from the output of the column multiplexer 10. As in the example from FIG. 1, the switching means 14 and the switching means 16 of the column multiplexer 10 are realized as NMOS transistors. The bitlines BL0-BL7 are precharged, prior to the actual read-out operation, to a potential corresponding to the negative supply voltage VSS. The common nodal point 20 is precharged, through a precharging switching means 26, to a potential corresponding to the positive supply voltage VDD. The precharging switching means 26 is designed as a PMOS transistor to complement the switching means 14 and 16 of the column multiplexer. The precharging switching means 26 is activated through a control signal PC for the measuring amplifier 30. The control signal PC of the measuring amplifier 30 interrupts the signal path from the signal input of the measuring amplifier 30 to the signal output of the measuring amplifier 30, between two read-out operations. Due to the complementary design of the precharging switching means 26, a connection of the common nodal point 20 to the positive supply voltage VDD is therefore established between two read-out operations, in order to effect the precharging of the common nodal point 20.

The example of a circuit arrangement, represented in FIG. 4, for the decoding of data stored using a bitline inversion coding corresponds in essence to the example explained with reference to FIG. 3. In the case of this example, however, switching means 14' and switching means 16' of the column multiplexer 10 are designed as PMOS transistors. Otherwise, these switching means 14' and 16' correspond to the switching means 14 and 16 of the example from FIG. 3. The precharging switching means 26' of the example from FIG. 4 is designed as an NMOS transistor to complement the switching means 14' and 16' of the column multiplexer 10. The charging switching means 26' connects the common nodal point 20 to the negative supply voltage VSS, in order to precharge the common nodal point 20 to a potential corresponding to the negative supply voltage VSS, between two read-out operations in each case. In the case of this example, the bitlines BL0-BL7 are precharged to a potential corresponding to the positive supply voltage VDD. The storage of the bitline inversion coding data is effected in that, at the connection points 18, in the manner previously described, a connection is selectively provided either to the predefined potential or to the further predefined potential, which potentials being, in the case of this example, the positive supply voltage VDD and the negative supply voltage VSS, respectively.

As evident from the preceding examples, a multiplicity of realizations of the circuit arrangement for the decoding of data stored using a bitline inversion coding are possible. In particular in this case, the potential to which the precharging of the bitlines BL0-BL7 is effected, the potential to which the precharging of the common nodal point 20 is effected, the structural design of the switching means of the column multiplexer 10 and the structural design of the precharging switching means used can be selected in dependence on the respective realization of the memory cells. Depending on whether or not the assignment has been reversed for one of the bitlines BL0-BL7, a connection is provided, at the respective connection point 18, either to the positive supply voltage VDD or to the negative supply voltage VSS, such that the desired selective inversion of the data read out from the memory cells is achieved. Furthermore, the previously discussed output structure from FIG. 1 may also be realized in a manner differing from the represented exemplary embodiment, without departure from the fundamental concept of the invention.

It is therefore intended that the foregoing detailed description be regarded as illustrative rather than limiting, and that it be understood that it is the following claims, including all equivalents, that are intended to define the spirit and scope of this invention.

The invention claimed is:

1. A permanent storage device comprising:
a plurality of memory cells, each of the plurality of memory cells operative to assume a first state or a second state;
a plurality of wordlines connected to the plurality of memory cells;
a plurality of bitlines connected to the plurality of memory cells;
a plurality of inverters, connected to the plurality of bitlines, each of the plurality of inverters operative to selectively invert a value of at least one bitline of the plurality of bitlines; and
a multiplexer coupled with the plurality of bitlines, the multiplexer comprising a switching device activated by a control signal, the switching device operative to connect at least one of the plurality of bitlines to an output structure connected to the multiplexer at a connection point;
wherein each of the plurality of memory cells is addressable through at least one wordline of the plurality of wordlines and at least one bitline of the plurality of bitlines; and
wherein a first stored value comprises a first non-inverted or inverted assignment of the first or second state of each the plurality of memory cells and a second stored value comprises a second non-inverted or inverted assignment of the first or second state of each the plurality of memory cells.

2. The storage device of claim 1, wherein the first stored value comprises at least one non-inverted assignment of a state of at least one of the plurality of memory cells and at least one inverted assignment of a state of at least one of the plurality of memory cells.

3. The storage device of claim 2, wherein the connection point is operative to receive a predefined potential.

4. The storage device of claim 1, wherein the control signal of the multiplexer comprises a bitline control signal for activation of the switching device.

5. The storage device of claim 4, wherein the multiplexer further comprises a precharging switching device to precharge a common nodal point connected to each of the plurality of bitlines, the precharging switching device activated by the bitline control signal.

6. The storage device of claim 1, wherein the multiplexer receives a reference bitline.

7. The storage device of claim 6, wherein the output structure comprises:
a measuring amplifier connected to the multiplexer, the measuring amplifier of differential design and operative to measure the charge state of the plurality of bitlines relative to the reference bitline.

8. A permanent storage device comprising
a plurality of memory cells, each of the plurality of memory cells operative to assume a first state or a second state;
a plurality of wordlines connected to the plurality of memory cells;
a plurality of bitlines connected to the plurality of memory cells;
a plurality of inverters connected to the plurality of bitlines, each of the plurality of inverters operative to selectively inverts a value of at least one of the plurality of bitlines; and
a multiplexer coupled to the plurality of bitlines, the multiplexer comprising:
a switching device operative to connect at least one of the plurality of bitlines to an output structure connected to the multiplexer at a connection point, the switching device activated by a control signal of the multiplexer; and
a precharging switching device operative to precharge a common nodal point connected to each of the plurality of bitlines, the precharging switching device activated by the control signal of the multiplexer;
wherein each of the plurality of memory cells is addressable through at least one wordline of the plurality of wordlines and at least one bitline of the plurality of bitlines; and
wherein a first stored value comprises a first non-inverted or inverted assignment of the first or second state of each of the plurality of memory cells.

9. The permanent storage device of claim 8, wherein the first stored value comprises at least one non-inverted assignment of a state of at least one of the plurality of memory cells and at least one inverted assignment of a state of at least one of the plurality of memory cells.

10. The permanent storage device of claim 8, wherein the multiplexer receives a reference bitline and wherein the output structure comprises a measuring amplifier connected to the multiplexer, the measuring amplifier of differential design and operative to measure the charge state of the plurality of bitlines relative to the reference bitline.

11. A permanent storage device comprising:
a plurality of memory cells, each of the plurality of memory cells operative to assume a first state or a second state;
addressing means for addressing the plurality of memory cells;
inverting means for selectively a value associated with a first or second state of at least one of the plurality of memory cells; and
multiplexing means for passing a value associated with the first or second state of at least one of the plurality of memory cells to an outputting means; and
the outputting means for outputting at least a first stored value comprising a first non-inverted or inverted assignment of the first and second state of the plurality of memory cells.

* * * * *